United States Patent
Kondoh et al.

[11] Patent Number: 5,811,668
[45] Date of Patent: Sep. 22, 1998

[54] METHOD OF MEASURING CHARACTERISTICS OF A DC MOTOR, APPARATUS FOR IMPLEMENTING THE METHOD, AND METHOD OF CALCULATING INDUCTIVE VOLTAGE THEREOF

[75] Inventors: Mikihiro Kondoh, Okazaki; Kaneyoshi Nagatani, Kariya, both of Japan

[73] Assignees: ASMO Co., Ltd., Kosai; Denso Corporation, Kariya, both of Japan

[21] Appl. No.: 748,659

[22] Filed: Nov. 14, 1996

[30] Foreign Application Priority Data

Nov. 15, 1995 [JP] Japan .................................... 7-297150
Oct. 14, 1996 [JP] Japan .................................... 8-271094

[51] Int. Cl.$^6$ ........................... G01M 15/00; G01R 31/34
[52] U.S. Cl. ............................................................ 73/116
[58] Field of Search ................................. 73/116, 117.2, 73/117.3, 118.1, 865.9, 117, 862.17

[56] References Cited

U.S. PATENT DOCUMENTS

| | | | |
|---|---|---|---|
| 2,352,779 | 7/1944 | Ehrenfeld | 73/862.17 |
| 2,362,682 | 11/1944 | Watson | 73/862.17 |
| 3,595,073 | 7/1971 | Morris | 73/862.17 |
| 3,638,480 | 2/1972 | Calud | 73/59 |
| 3,898,875 | 8/1975 | Knoop et al. | 73/116 |
| 3,952,586 | 4/1976 | Hanson et al. | 73/116 |
| 4,091,662 | 5/1978 | Emanuel | 73/116 |
| 4,204,425 | 5/1980 | Mallick, Jr. | 73/116 |
| 4,922,172 | 5/1990 | Roddy et al. | 324/378 |
| 5,519,337 | 5/1996 | Casada | 324/772 |
| 5,623,104 | 4/1997 | Suga | 73/862.17 |

FOREIGN PATENT DOCUMENTS 6-311774  11/1994  Japan .

*Primary Examiner*—George M. Dombroske
*Attorney, Agent, or Firm*—Cushman Darby & Cushman, IP Group of Pillsbury Madison & Sutro LLP

[57] ABSTRACT

Electric current supplied to a DC motor and a rotational speed thereof are measured. An inductive voltage is calculated based on a relationship that the elapse of time after the application of a voltage to the DC motor is stopped is proportional to the voltage across the terminals of the DC motor. The electric current supplied to the DC motor when the rotation of the DC motor is locked is measured by applying the voltage to the DC motor when a magnetic pole of a stator of the DC motor is not magnetized. The torque of the DC motor when the rotation of the DC motor is locked is measured based on the electric current supplied to the DC motor and the rotational speed thereof when it rotates, the electric current supplied to the DC motor when the rotation of the DC motor is locked, and the inductive voltage. The torque of the DC motor when the rotation of the DC motor is locked is used to determine the torque characteristics thereof.

18 Claims, 6 Drawing Sheets

METHOD OF MEASURING CHARACTERISTICS OF A DC MOTOR, APPARATUS FOR IMPLEMENTING THE METHOD, AND METHOD OF CALCULATING INDUCTIVE VOLTAGE THEREOF

CROSS-REFERENCE TO RELATED APPLICATION

This application is related to and claims priority from Japanese Patent Application Nos. Hei 7-297150 and Hei 8-271094, incorporated herein by reference.

BACKGROUND OF THE INVENTION

1. Field of the Invention

The present invention generally relates to a method of measuring the characteristics of a permanent magnet-type DC motor and other types of DC motors; an apparatus for carrying out the method; and a method of calculating the inductive voltage thereof. More particularly, the present invention relates to a method of measuring the characteristics of the DC motor which eliminates the need for a mechanical torque measurement; an apparatus for carrying out the method; and a method of calculating the inductive voltage thereof.

2. Description of Related Art

The characteristics of the DC motor can be determined by measuring the output torque thereof, the electric current flowing therethrough, and the rotational speed thereof when a specified voltage is applied thereto.

FIG. 6 shows the outline of a conventional construction to be used to measure the characteristics of a permanent magnet type-DC motor 1. As shown in FIG. 6, an output shaft 11 of the DC motor 1 is connected with one rotation shaft 31 of a torque-voltage converter 3 through a joint 2, and an electromagnetic brake 4 is connected with the other rotation shaft 34 of the torque-voltage converter 3.

In measuring the characteristics of the DC motor 1, the DC motor 1 is rotated by applying a specified voltage thereto, with the electromagnetic brake 4 turned off and with no load applied to the DC motor 1. Electric current flowing through the DC motor 1 and the rotational speed are measured in the above-described state, namely, in the load-unapplied state. Further, electric current flowing through the DC motor 1 and its output torque are measured by actuating the electromagnetic brake 4 and applying a predetermined load to the DC motor 1.

In recent years, a DC motor 1A incorporated in a pump as shown in FIG. 7 is widely used. That is, the DC motor 1A comprises the DC motor 1 and a pump added thereto. An output shaft 11 of the DC motor 1A does not project outside of a yoke housing 12, as was the case with the output shaft 11 of the DC motor 1.

The construction of the DC motor 1A is described below with reference to FIG. 7. The yoke housing 12 is connected to a pump housing 13. The output shaft 11 supporting a rotor 14 integral therewith projects into the pump housing 13 and is rotatably supported therein. A bearing 15 is supported at an eccentric part of the output shaft 11 projecting into the pump housing 13. The bearing 15 is in contact with one end of a plunger (not shown) installed inside an insertion hole 131 vertically formed, thus reciprocating the plunger due to the eccentric action of the eccentric part of the output shaft 11.

Magnetic poles 16 fixed to the inner surface of the wall of the yoke housing 12 are formed by permanent magnet made of ferrite. Winding 14c is wound on the core 14a of the rotor 14 through slots 14b formed on the core 14a. Exciting current is supplied to the winding 14c through a brush 18 in contact with a commutator 17 of the output shaft 11. Four magnetic poles 16 are arranged at regular intervals on the inner surface of the wall of the yoke housing 12. Twelve slots 14b are formed at regular intervals on the peripheral surface of the core 14a. The stator of the DC motor 1A is composed of the yoke housing 12 and the magnetic poles 16.

The characteristics of the DC motor 1A are measured as follows:

As shown in FIG. 7, a rectangular hole 111 coaxial with the output shaft 11 is formed inside the output shaft 11 at its end positioned on the yoke housing side. A rotation shaft 31 of a torque-voltage converter 3 is inserted into the rectangular hole 111 to connect the rotation shaft 31 and the output shaft 11 with each other.

It is necessary to form an opening 121 on the vertical wall of the yoke housing 12 to insert the rotation shaft 31 into the rectangular hole 111. After the characteristics of the DC motor 1A are measured, it is necessary to close the opening 121 with a cap 19. Such a measuring method causes the construction of the DC motor 1A to be complicated, thus leading to a high manufacturing cost.

According to Laid-Open Japanese Patent Publication No. Hei 6-311774, instead of the above-described mechanical torque measurement, the ohmic loss of a main pole is estimated based on the reactance voltage of a commutating pole and the voltage between terminals of a DC motor. The inductive voltage of the DC motor and its output torque are calculated based on the ohmic loss. This method is, however, applicable only to the DC motor having the commutating pole and is incapable of indicating its entire characteristics. In addition, much time and labor are required in this method because it is necessary to measure many points.

SUMMARY OF THE INVENTION

The present invention is intended to solve the above-described problems. It is accordingly an object of the present invention to provide a method of measuring the characteristics of a DC motor; an apparatus for carrying out the method; and a method of calculating the inductive voltage thereof, using a construction simple and inexpensive and applicable even to a DC motor incorporated in a pump.

In order to achieve the above objects, a first aspect of the present invention provides a method including the steps of actuating a DC motor by applying a voltage thereto; measuring electric current supplied to the DC motor and a rotational speed thereof when the DC motor rotates; determining electric current flowing through the DC motor when the rotation of the DC motor is locked; stopping the voltage application to the DC motor; calculating an inductive voltage of the DC motor when the voltage application to the DC motor is stopped, based on a relationship between a period of time which has elapsed after the voltage application to the DC motor is stopped and a voltage across terminals of the DC motor; and calculating the torque of the DC motor when the rotation of the DC motor is locked, based on the electric current supplied thereto, the inductive voltage thereof, the electric current flowing therethrough when the rotation of the DC motor is locked, and the rotational speed thereof.

The rotational speed of a DC motor and electric current flowing therethrough change substantially linearly with respect to its torque. Thus, the characteristics of the DC motor can be determined by calculating the electric current supplied thereto and its torque when it rotates with the voltage applied thereto, and the electric current flowing through the DC motor and the torque when the rotation of the DC motor is locked. In particular, because the electric current flowing through the DC motor when the rotation of the DC motor is locked is used, the entire characteristics of the DC motor can be measured with high accuracy.

In this case, the inductive voltage of the DC motor while the voltage is applied is calculated based on the relationship that the elapse of time after the application of the voltage to the DC motor is stopped is proportional to the voltage across the terminals of the DC motor. Accordingly, the inductive voltage of the DC motor can be detected regardless of whether or not a load is applied thereto, and the torque when it rotates and the torque when its rotation is stopped can be accurately measured.

Further, it is not necessary to measure the torque of the DC motor by the conventional mechanical torque measuring method. Therefore, measuring devices can be allowed to be compact and simple, which reduces measuring cost. In particular, the DC motor incorporated in a pump is allowed to have a simple construction because its output shaft does not project outside of the yoke housing. Hence, the present invention provides an inexpensive method of measuring the motor's characteristics.

Another aspect of the present invention provides a measuring method comprises the step of actuating the DC motor by applying a voltage thereto; measuring electric current supplied to the DC motor and a rotational speed thereof when the DC motor rotates; determining electric current flowing through the DC motor when the rotation of the DC motor is locked; calculating the torque of the DC motor when the DC motor rotates, based on the voltage applied thereto, the electric current supplied thereto, and the rotational speed thereof; and calculating the torque of the DC motor when the rotation of the DC motor is locked, based on an inductive voltage of the DC motor when the voltage application thereto is stopped, the electric current flowing through the DC motor when the rotation of the DC motor is locked, the electric current supplied to the DC motor and the rotational speed thereof when the DC motor rotates.

As described above, the rotational speed of a DC motor and electric current flowing therethrough change substantially linearly with respect to its torque. Thus, the entire characteristics of the DC motor can be clearly shown by data indicating its characteristics.

Still another aspect of the present invention provides a measuring method comprising the step of actuating a DC motor in the load-unapplied state by applying a voltage thereto; measuring electric current supplied to the DC motor and a rotational speed thereof when the DC motor rotates in the load-unapplied state; determining electric current flowing through the DC motor when the rotation of the DC motor is locked; calculating the torque of the DC motor when the rotation of the DC motor is locked, based on an inductive voltage of the DC motor when the voltage application thereto is stopped, the electric current supplied to the DC motor when the DC motor rotates in the load-unapplied state, the electric current flowing through the DC motor when the rotation of the DC motor is locked, and the rotational speed thereof when the DC motor rotates in the load-unapplied state.

The electric current flowing through the DC motor when the rotation of the DC motor is locked can be measured by applying the voltage to the DC motor when a magnetic pole of a stator of the DC motor is not magnetized. In addition to the state in which the magnetic pole comprising a permanent magnet of the stator installed on the permanent magnet-type DC motor is not magnetized, "unmagnetized state" means the state in which winding wound on the magnetic pole of the stator of the DC motor other than permanent magnet-type DC motor is not magnetized.

The electric current flowing through the DC motor when the rotation of the DC motor is locked may be calculated based on the voltage applied thereto and the resistance of the rotor thereof.

As a further feature of the present invention provides a measuring method comprises the step of actuating the DC motor by applying a voltage thereto and stopping applying the voltage thereto; and calculating the inductive voltage of the DC motor when the voltage application to the DC motor is stopped, based on a relationship between a period of time which has elapsed after the voltage application to the DC motor is stopped and a voltage across terminals of the DC motor.

DETAILED DESCRIPTION OF THE PRESENTLY PREFERRED EXEMPLARY EMBODIMENTS

A first preferred embodiment of the present invention will be described below with reference to the drawings.

Figure 1:
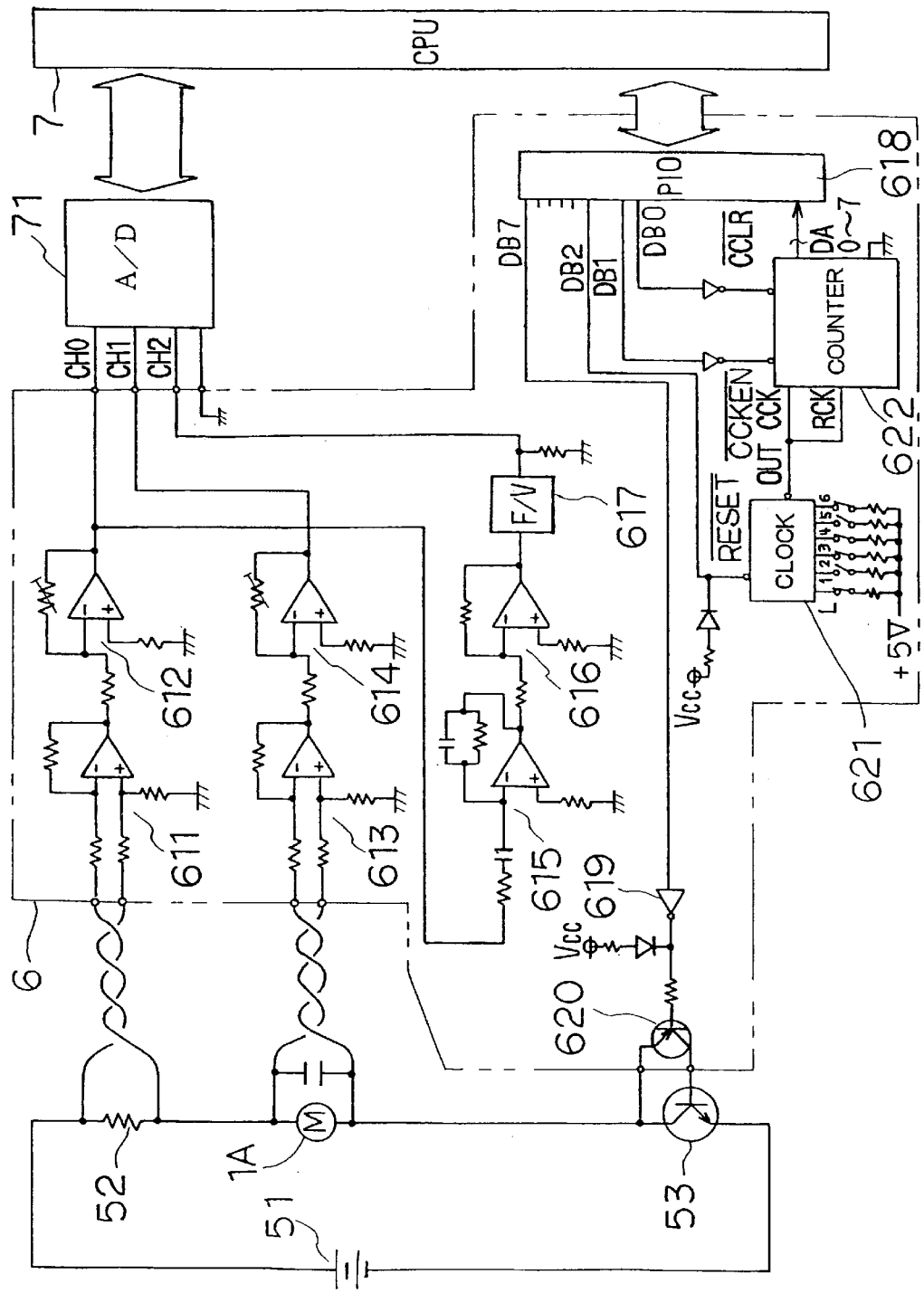
FIG. 1 is a circuit diagram to be used in a method, according to a first preferred embodiment of the present invention, of measuring the characteristics of a DC motor.
Figure 7:
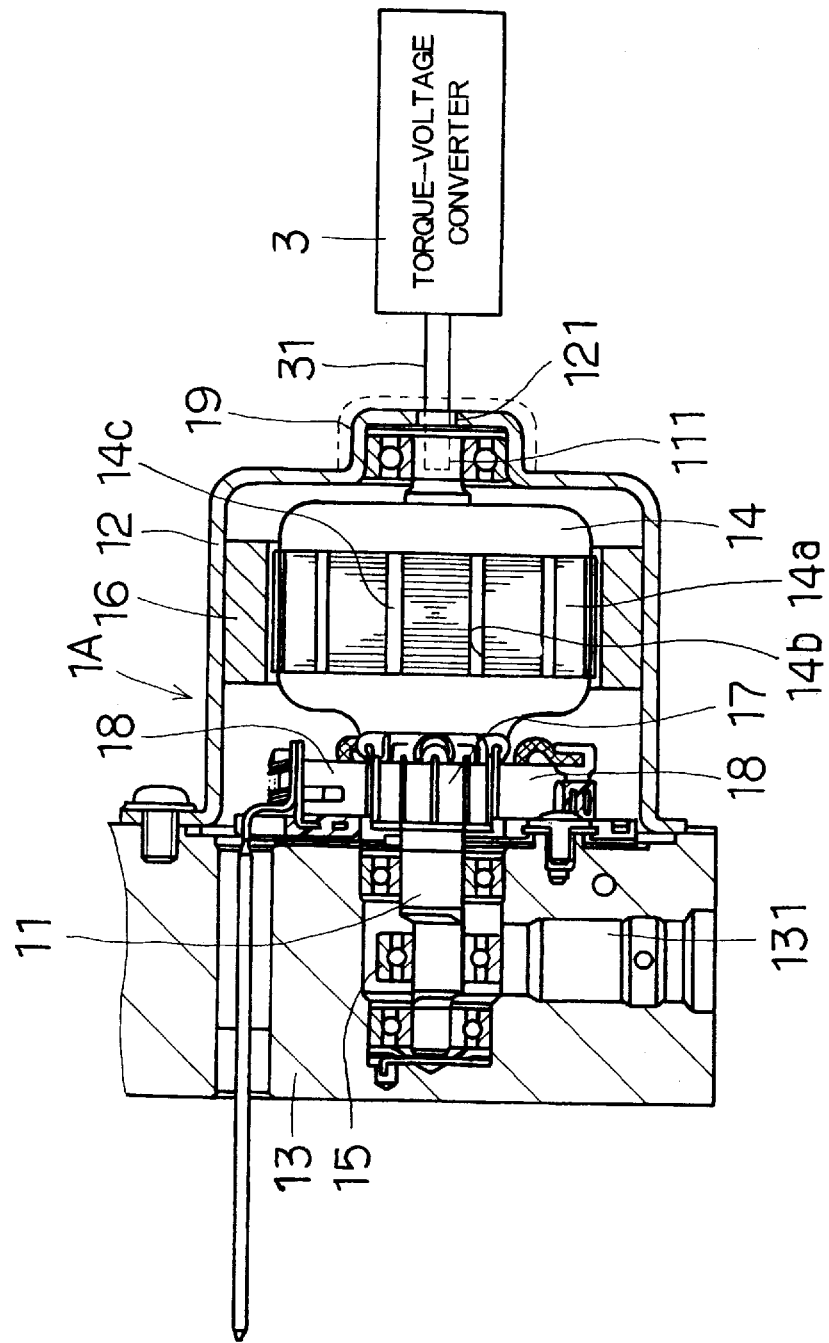
FIG. 7 is a vertical cross-sectional view showing a DC motor incorporated in a pump according to the prior art.

FIG. 1 shows an example of the construction of a circuit to be used to measure the characteristics of the DC motor 1A shown in FIG. 7. Referring to FIG. 1, a construction for connecting the rotation shaft 31 of the torque-voltage converter 3 and the output shaft 11 with each other is not added to the yoke housing 12 of the DC motor 1A or to its output shaft 11, which means that the output shaft 11 does not project outside of the yoke housing 12.

A positive terminal of the DC motor 1A is connected to a positive terminal of a DC power source 51 through a detection resistor 52, whereas a negative terminal of the DC motor 1A is connected to a negative terminal of the DC power source 51 through a circuit-opening/closing switching transistor 53 which controls electric power supplied to the DC motor 1A. The voltage, across the detection resistor 52, which is proportional to the electric current supplied to the DC motor 1A, is amplified by a differential amplifier 611 positioned at the detection resistor side of a measuring circuit 6, amplified by an inverting amplifier circuit 612 at the output of the differential amplifier 611, and then outputted to an A/D converter 71 and a high-pass filter 615.

The voltage amplified by the inverting amplifier circuit 612 is proportional to the electric current supplied to the DC motor 1A. The high-pass filter 615 filters the voltage amplified by the inverting amplifier 612, thus outputting a pulsation signal having a frequency proportional to the rotational speed of the DC motor 1A to an inverting amplifier 616. Upon receipt of the pulsation signal, the inverting amplifier circuit 616 amplifies it and provides the amplified pulsation signal to a F/V converter 617. The F/V converter 617 converts the pulsation signal into a voltage proportional to the frequency of the pulsation signal and then outputs the voltage to the A/D converter 71.

Description is made below of the reason why the frequency of the pulsation signal, and therefore the output voltage of the F/V converter 617, is proportional to the rotational speed of the DC motor 1A.

As described above, each of four magnetic poles 16 of the DC motor 1A is made from a permanent magnet, and the number of the slots 14c of the core 14 is 12. Therefore, cogging torque inherent in the DC motor 1A is generated 12 times per rotation thereof in correspondence to the number of intervals in the core 14, namely, the number of the slots 14c. This means that the load to be applied to the DC motor 1A fluctuates in correspondence to the number of times the cogging torque is generated.

Therefore, electric current flowing through the detection resistor 52, and therefore the voltage generated across it, pulsates in correspondence with the number of times of the cogging torque is generated.

Accordingly, the number of pulsations of the voltage across the detection resistor 52 per rotation of the DC motor 1A can be regarded as being proportional to the rotational speed of the DC motor 1A. Consequently, the output voltage of the F/V converter 617 is proportional to the rotational speed of the DC motor 1A.

The voltage between the positive and negative terminals of the DC motor 1A is amplified by a differential amplifier 613 at the DC motor side of the measuring circuit 6, amplified by an inverting amplifier 614 at the rear of the differential amplifier 613, and then outputted to the A/D converter 71. The voltage amplified by the inverting amplifier circuit 614 is proportional to the voltage across the terminals of the DC motor 1A. The A/D converter 71 converts each of the voltage amplified by the inverting amplifier 612, the voltage amplified by the inverting amplifier 614, and the voltage outputted from the F/V converter 617 into 8-bit digital data and outputs the data to the CPU 7.

An input/output interface circuit 618 (hereinafter referred to as PIO circuit 618) and an inverter 619 are interposed between the CPU 7 and a transistor 620 connected with the switching transistor 53. Under the control of the CPU 7, the PIO circuit 618 generates an output for driving the transistor 620 from an output port DB7 thereof through the inverter 619. As the PIO circuit 618, a type 8255 integrated circuit manufactured by Nippon Electric Co., Ltd. is adopted in this embodiment.

A clock 621 is reset appropriately by signals outputted from an output port DB2 of the PIO circuit 618. Clock signals generated by the clock 621 are inputted to an 8-bit counter 622 to be reset by signals outputted from output ports DB1 and DB0 of the PIO circuit 618. An output of the counter 622 is inputted to an 8-bit input ports DA0–DA7 of the PIO circuit 618. Parallel bus communication is executed between the PIO circuit 618 and the CPU 7. As the clock 621, a type 8640BN integrated circuit manufactured by Epson Co., Ltd. is adopted in this embodiment. As the counter 622, a type SN74LS590 integrated circuit is used. Alternatively, the function of the counter 622 may be implemented by the CPU 7.

Figure 2:
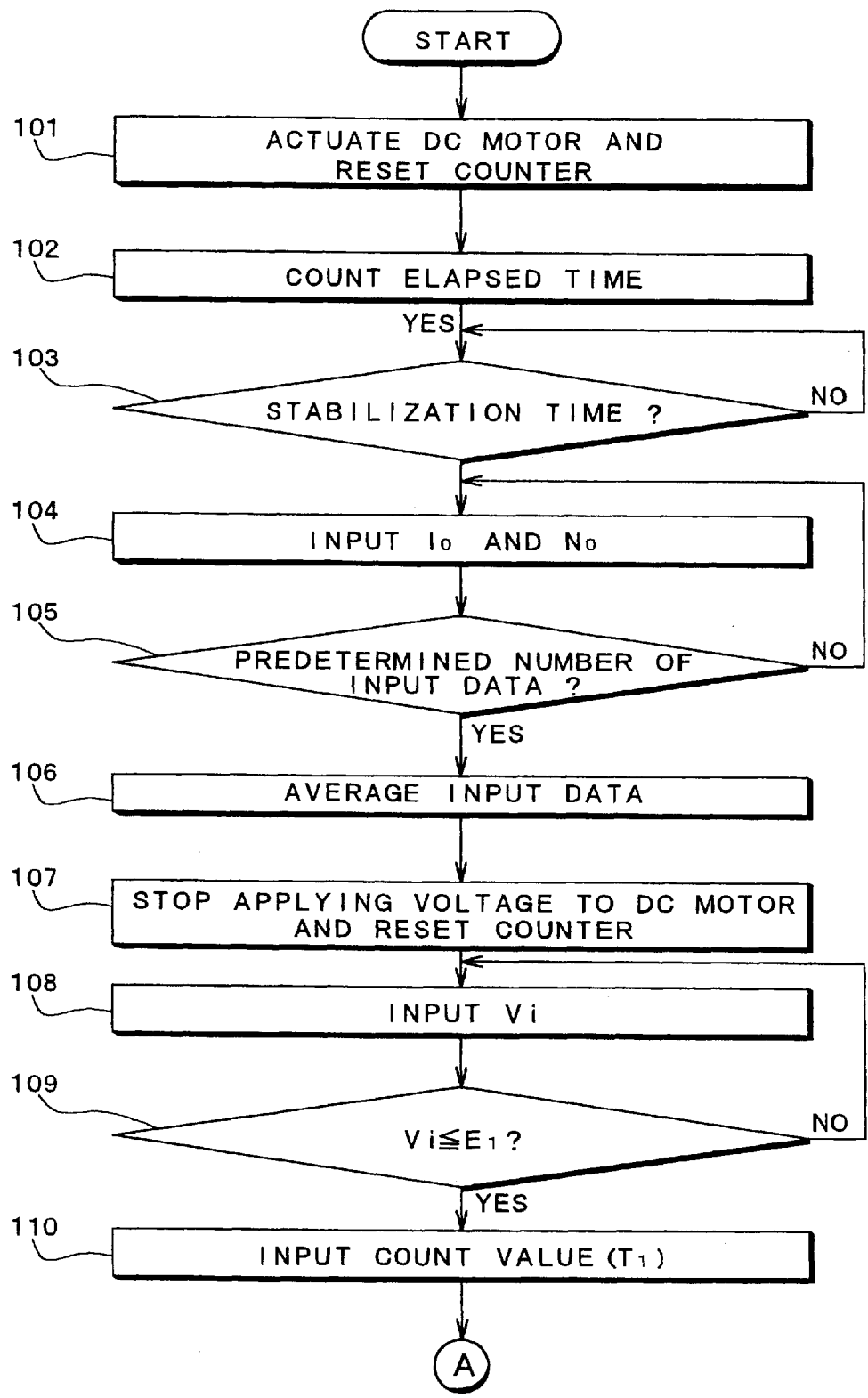
FIG. 2 is a part of a flowchart to be used in the processing of a CPU according to the first embodiment.
Figure 3:
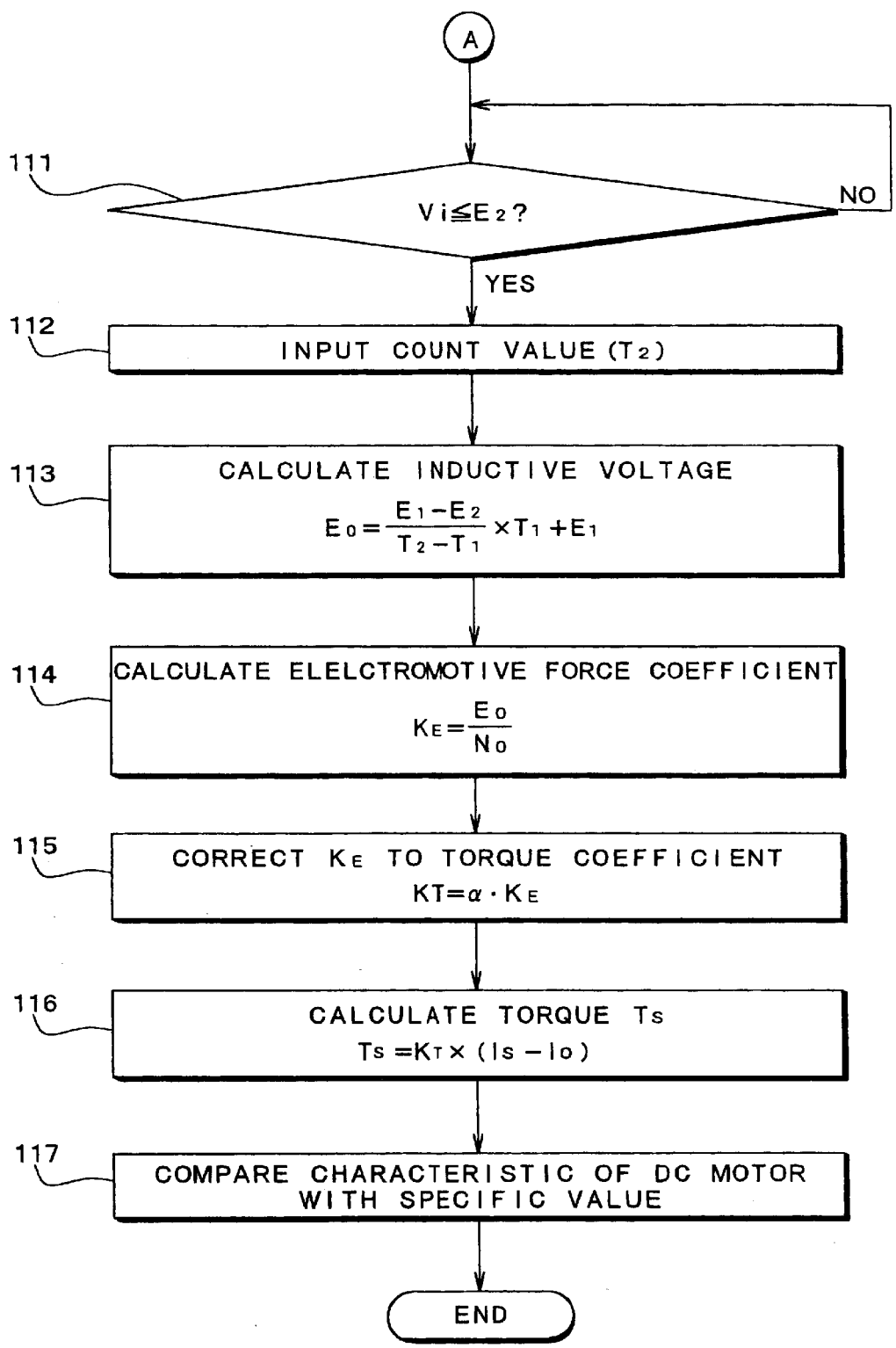
FIG. 3 is a part of the flowchart to be used in the processing of a CPU according to the first embodiment.

The procedure of the processing to be executed by the CPU 7 is described below with reference to flowcharts shown in FIGS. 2 and 3.

At step 101, based on an instruction issued from the CPU 7 to the PIO circuit 618, the switching transistor 53 is turned on via the inverter 619 and the transistor 620. As a result, the DC power source 51 generates a predetermined voltage V, thus actuating the DC motor 1A. Ignoring a load applied to the DC motor 1A incorporated in a pump, no load is applied to the DC motor 1A. Based on an instruction issued from the CPU 7 to the PIO circuit 618, the counter 622 is reset by a signal outputted from the PIO circuit 618. Consequently, the counter 622 starts to count clock signals outputted thereto from the clock 621.

At step 102, based on a value counted by the counter 622, a period of time which has elapsed after the DC motor 1A is actuated is measured. Step 103 determines whether the measured period of time is coincident with the operation stabilization time of the DC motor 1A.

If YES at step 103, the CPU 7 receives the digital data indicating the voltage amplified by the inverting amplifier 612 through the A/D converter 71 at step 104. Upon receipt of the digital data, the CPU 7 converts it into electric current $I_0$ supplied to the DC motor 1A to which no load is applied. The CPU 7 also receives the digital data indicating the voltage outputted from the F/V converter 617 via the A/D converter 71 as a number $N_0$ of rotations of the DC motor 1A in the load-unapplied state.

Step 105 determines whether a predetermined amount of digital data has been inputted to the CPU 7. If YES, the digital data is averaged at step 106.

At step 107, based on an instruction issued from the CPU 7 to the PIO circuit 618, the switching transistor 53 is turned off and the counter 622 is reset. Consequently, the application of the voltage from the DC power source 51 to the DC motor 1A is stopped, and the counter 622 starts counting clock signals (see time t1 shown in FIG. 4, which will be described later.)

Then, at step 108, the CPU 7 receives digital data indicating a voltage Vi (inductive voltage) across the terminals of the DC motor 1A in a voltage-unapplied state via the A/D converter 71.

Step 109 determines whether the voltage Vi across the terminals of the DC motor 1A has dropped to a predetermined voltage $E_1$. If YES at step 109, a value corresponding to time $T_1$ shown in FIG. 4 measured by the counter 622 is inputted to the CPU 7 at step 110.

Figure 4:
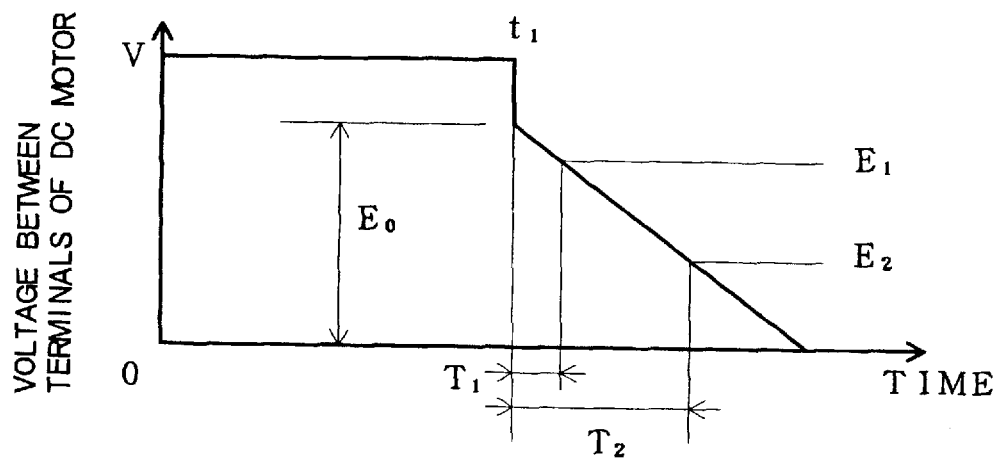
FIG. 4 is a graph showing a change in a voltage across terminals of the DC motor with the elapse of time according to the first embodiment.

Step 111 determines whether the voltage Vi across the terminals of the DC motor 1A has dropped to a predetermined voltage $E_2$ (see FIG. 4.) If YES at step 111, the CPU 7 receives the value corresponding to time $T_2$ shown in FIG. 4 measured by the counter 622 at step 112.

Then, at step 113, an inductive voltage $E_0$ of the DC motor 1A rotating in the voltage-unapplied state and in the load-unapplied state is calculated, using Equation (1) shown below:

$$E_0=(E_1-E_2)\times T_1/(T_2-T_1)+E_1 \qquad \ldots (1)$$

FIG. 4 shows the relationship among the times $T_1$ and $T_2$, the predetermined voltages $E_1$ and $E_2$, and the inductive voltage $E_0$. In the above Equation (1), $t_1$ is a time when the application of the voltage V to the DC motor 1A is stopped. The voltage Vi across the terminals of the DC motor 1A at the time $t_1$ is the inductive voltage $E_0$ of the DC motor 1A rotating in the load-unapplied state. The inductive voltage $E_0$ drops substantially linearly with the elapse of time, as shown in FIG. 4. That is, the inductive voltage $E_0$ drops to $E_1$ with the elapse of time $T_1$ and to $E_2$ with the elapse of time $T_2$. Accordingly, the inductive voltage $E_0$ can be calculated using Equation (1).

At step 114, an electromotive force coefficient $K_E$ is calculated based on the number $N_0$ of rotations of the DC motor 1A in the load-unapplied state and the inductive voltage $E_0$, using Equation (2) shown below:

$$K_E = E_0/N_0 \quad \ldots (2)$$

In Equation (2), the electromotive force coefficient $K_E$ is proportional to the intensity of the magnetic field of the DC motor 1A.

At step 115, the electromotive force coefficient $K_E$ is corrected to a torque coefficient $K_T$ using Equation (3) shown below:

$$K_T = \alpha \times K_E$$

where $\alpha$ is a constant (normally, $30/\pi$) which may be corrected for temperature correction as necessary.

At step 116, using Equation (4) shown below, a torque $T_S$ at the time when the output shaft 11 of the DC motor 1A is locked (i.e., rotation of the DC motor 1 is constrained or forcibly stopped) is calculated.

$$T_S = K_T \times (I_S - I_0) \quad \ldots (4)$$

where $I_S$ is electric current flowing through the DC motor 1A at the output shaft-locked time. The electric current $I_S$ is measured in advance by applying the specified voltage V to the DC motor 1A before the magnetic poles 16 of the DC motor 1A are magnetized. Otherwise, the electric current $I_S$ at the output shaft-locked time is calculated based on a measured value of the resistance Ra of the winding 14c of the rotor 14, utilizing Equation (5) shown below. In this manner, the electric current $I_S$ at the shaft-locked time can be calculated even when the magnetic poles 16 of the DC motor 1A are magnetized.

$$I_S = V/Ra \quad \ldots (5)$$

Utilizing the following values measured in the above-described manner, the characteristics of the DC motor 1A are determined by comparing with a specified value: the electric current $I_0$ to be supplied to the DC motor 1A in the load-unapplied state when the specified voltage V is applied to the DC motor 1A, the rotational speed $N_0$ of the DC motor 1A in the load-unapplied state, the electric current $I_S$ flowing through the DC motor 1A at the shaft-locked time, and the torque $T_S$ at the shaft-locked time. The specified value is a characteristic-determining value required by a user.

Figure 5:
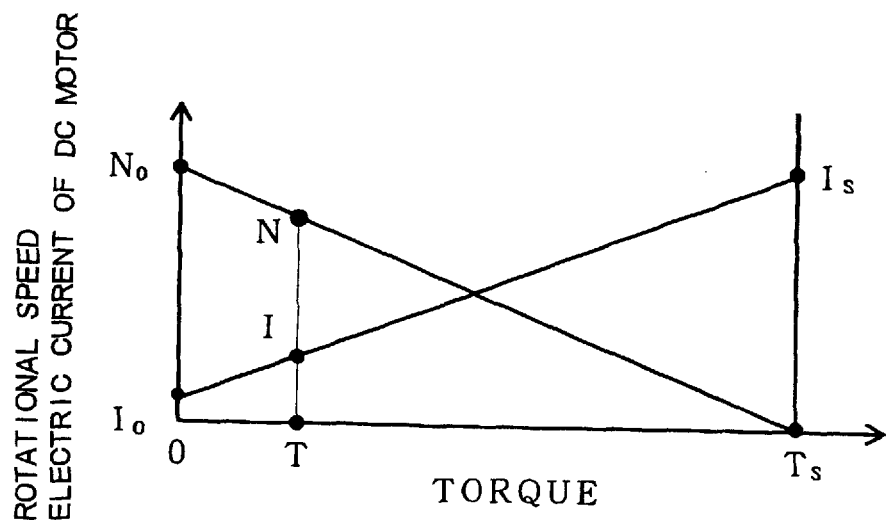
FIG. 5 is a graph showing the relationship between the torque of the DC motor and its rotational speed as well as electric current therethrough according to the first embodiment.
Figure 6:
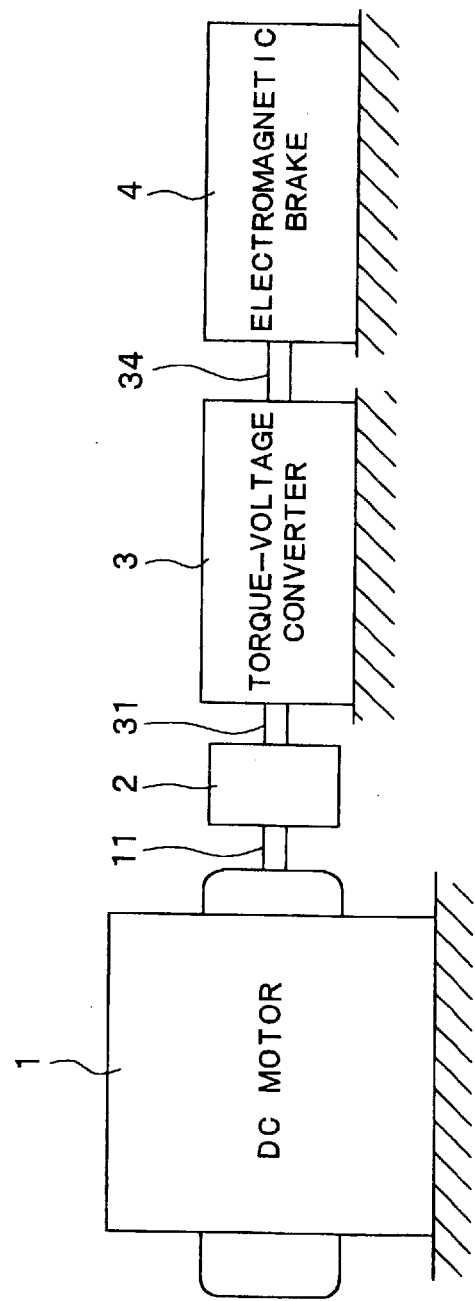
FIG. 6 is a schematic side view showing equipment to be used in a conventional method of measuring the characteristics of a DC motor.

Generally, the rotational speed of a DC motor and electric current flowing therethrough change substantially linearly with respect to its torque. Therefore, an equation of the proportional relationship between the rotational speed of the DC motor 1A and its torque and an equation of the proportional relationship between the electric current flowing therethrough and its torque can be obtained by determining the electric current $I_0$ supplied to the DC motor 1A in the load-unapplied state when the specified voltage V is applied to the DC motor 1A, the rotational speed $N_0$ of the DC motor 1A in the load-unapplied state, the electric current $I_S$ flowing through the DC motor 1A at the shaft-locked time, and the torque $T_S$ at the shaft-locked time. FIG. 5 shows the equations of the proportional relationships, namely the characteristics of the DC motor 1A.

At step 117, the equations of the proportional relationships are determined and it is determined whether the equations of the proportional relationships satisfy the specified criteria.

In this manner, it is determined whether or not the DC motor 1A satisfies the characteristics required by the user.

The equations allow an accurate determination of the characteristics of the DC motor 1. Because the torque at the output shaft-locked time results from the characteristics of the DC motor 1A, as described above, it is unnecessary to measure its characteristics by the conventional mechanical torque-measuring method. That is, the method of the present invention can be carried out at a low cost, using a DC motor 1A having a simple construction.

In this embodiment, the inductive voltage is substantially equal to the specified voltage V in the load-unapplied state. Thus, the inductive voltage $E_0$ of Equation (2) may be replaced with the specified voltage V.

In this embodiment, the characteristics such as the inductive voltage $E_0$ of the DC motor 1A are determined in the load-unapplied state, but according to a second preferred embodiment of the present invention, they may be obtained in a load-applied state as described below.

At step 101, the DC power source 51 applies the specified voltage V, with a load applied thereto, thus actuating the DC motor 1A.

At step 104, the CPU 7 receives electric current I supplied to the DC motor 1A and the rotational speed N of the DC motor 1A in a load-applied state, instead of the electric current $I_0$ and the rotational speed $N_0$ in the load-unapplied state.

At step 113, instead of the inductive voltage $E_0$, an inductive voltage E of the DC motor 1A rotating when the application of the voltage to the DC motor 1A is stopped in the load-applied state is calculated using Equation (1).

At step 114, an electromotive force coefficient $K_E$ of the DC motor 1A in the load-applied state is calculated based on the inductive voltage E and the rotational speed N instead of the inductive voltage $E_0$ and the number $N_0$ of rotations in the load-unapplied state, using Equation (2).

At step 115, a torque coefficient $K_T$ is calculated based on the electromotive force coefficient $K_E$ in the load-applied state, using Equation (3).

At step 116, a torque T in the load-applied state is calculated based on the product of the torque coefficient $K_T$ and the electric current I supplied to the DC motor 1A. Further, a torque Ts in the load-applied state and the output shaft-locked state is calculated using Equation (4).

As the electric current $I_S$ in the output shaft-locked state, a value measured by applying the specified voltage V to the DC motor 1A in the load-applied state before the magnetic poles 16 of the DC motor 1A are magnetized is used instead of the electric current $I_S$ in the output shaft-locked state described in the first embodiment. Otherwise, the electric current $I_S$ at the output shaft-locked time is calculated based on the measured value of the resistance Ra of the winding 14c of the rotor 14, utilizing Equation (5).

As the electric current $I_0$ in the load-unapplied state, the electric current I is used. The other features are similar to those of the first embodiment.

As described above, an equation of the proportional relationship between the rotational speed of the DC motor 1A and its torque and an equation of the proportional relationship between the electric current flowing therethrough and its torque can be obtained by determining the rotational speed N of the DC motor 1A in the load-applied state, the torque T when the DC motor 1A is rotating, the electric current I (see FIG. 5) supplied to the DC motor 1A in the load-applied state, the electric current $I_S$ flowing through the DC motor 1A at the shaft-locked time, and the torque $T_S$ at the shaft-locked time. FIG. 5 shows the equations of the proportional relationships, namely the characteristics of the DC motor 1A.

As apparent from the above, even though load is applied to the DC motor 1A, the method of the present invention provides operation and effects similar to those of the above-described embodiment.

The present invention is not limited to the above-described embodiments and various changes and modifications can be made.

If it is possible to calculate a voltage drop Vb at a brush 18 of the DC motor 1A, Equation (6) shown below may be used instead of Equation (5) to calculate at the shaft-locked time. In this case, a more accurate electric current measurement at the shaft-locked time can be calculated.

$$I_S = (V - Vb)/Ra \qquad \ldots (6)$$

Further, Equation (7) shown below may be used instead of Equation (2) to calculate the electromotive force coefficient $K_E$:

$$K_E = (V - I \times Ra - Vb)/N \qquad \ldots (7)$$

where V is a voltage applied to the DC motor 1A, I is electric current supplied to the DC motor 1A in the load-applied state, Ra is the resistance of the winding 14c, Vb is the voltage drop at the brush 18, and N is the rotational speed of the DC motor 1A in the load-applied state.

The switching transistor 53 may be replaced with a power MOSFET. It is possible to omit the processing executed at step 105 and 106 as necessary.

In addition, the present invention is applicable not only to the permanent magnet type-DC motor 1A, but also to a DC motor having a stator provided with magnetic poles consisting of magnetic winding.

The cogging torques are generated per rotation of the DC motor in the presence of the slots. Thus, based on the number of times the cogging torque is generated, it is possible to determine the rotational speed of the DC motor. Further, it is possible to vary the number of stator magnetic poles of the DC motor and the number of slots of the rotor core.

What is claimed is:

1. A method of measuring a torque of a DC motor when a rotation thereof is locked as a characteristic thereof, said method comprising the steps of:

actuating the DC motor by applying a voltage thereto;

measuring electric current supplied to the DC motor and a rotational speed thereof when the DC motor rotates;

determining electric current flowing through the DC motor when the rotation of the DC motor is locked;

stopping the voltage application to the DC motor;

calculating an inductive voltage of the DC motor when the voltage application to the DC motor is stopped, based on a relationship between a period of time which has elapsed after the voltage application to the DC motor is stopped and a voltage across terminals of the DC motor; and calculating the torque of the DC motor when the rotation of the DC motor is locked, based on the electric current supplied thereto, the inductive voltage of the DC motor, the electric current flowing therethrough when the rotation of the DC motor is locked, and the rotational speed thereof.

2. The method according to claim 1, wherein the elapse of time after the application of the voltage to the DC motor is stopped is proportional to the voltage across the terminals of the DC motor; and the inductive voltage is calculated based on a relationship that the elapse of time after the application of the voltage to the DC motor is stopped is proportional to the voltage across the terminals of the DC motor.

3. The method according to claim 1, wherein the electric current when the rotation of the DC motor is locked is measured by applying a voltage to the DC motor before a magnetic pole of a stator of the DC motor is magnetized.

4. The method according to claim 1, wherein a resistance of a winding wound around a rotor of the DC motor is measured; and the electric current when the rotation of the DC motor is locked is calculated based on a voltage applied to the DC motor and a resistance of the winding.

5. The method according to claim 1, wherein the rotational speed of the DC motor is measured according to a pulsation of the electric current supplied to the DC motor.

6. The method according to claim 1, wherein the rotational speed of the DC motor is measured according to pulsations of the electric current supplied to the DC motor, based on a number of times cogging torque of the DC motor is generated.

7. A method of measuring a torque of a DC motor when a rotation thereof is locked and a torque thereof when the DC motor rotates as a characteristic thereof, said method comprising the steps of:

actuating the DC motor by applying a voltage thereto;

measuring electric current supplied to the DC motor and a rotational speed thereof when the DC motor rotates;

determining electric current flowing through the DC motor when the rotation of the DC motor is locked;

calculating the torque of the DC motor when the DC motor rotates, based on the voltage applied thereto, the electric current supplied thereto, and the rotational speed thereof; and calculating the torque of the DC motor when the rotation of the DC motor is locked, based on an inductive voltage of the DC motor when the voltage application thereto is stopped, electric current flowing through the DC motor when the rotation of the DC motor is locked, the electric current supplied to the DC motor and the rotational speed thereof when the DC motor rotates.

8. The method according to claim 7, wherein as the inductive voltage is used a voltage generated across terminals of the DC motor when the voltage application to the DC motor is stopped.

9. A method of measuring a torque of a DC motor when a rotation thereof is locked as a characteristic thereof, said method comprising the steps of:

actuating the DC motor in the load-unapplied state by applying a voltage thereto;

measuring electric current supplied to the DC motor and a rotational speed thereof when the DC motor rotates in the load-unapplied state;

determining electric current flowing through the DC motor when the rotation of the DC motor is locked;

calculating the torque of the DC motor when the rotation of the DC motor is locked, based on an inductive voltage of the DC motor when the voltage application thereto is stopped, electric current supplied to the DC motor when the DC motor rotates in the load-unapplied state, the electric current flowing through the DC motor when the rotation of the DC motor is locked, and the rotational speed thereof when the DC motor rotates in the load-unapplied state.

10. A method of calculating an electromotive force coefficient of a DC motor, said method comprising the steps of:

actuating the DC motor by applying a voltage thereto;

measuring a rotational speed of the DC motor while it is rotating and the voltage is applied thereto;

stopping application of the voltage to the DC motor;

calculating an inductive voltage of the DC motor when the voltage application to the DC motor is stopped, based on a relationship between a period of time which has elapsed after the voltage application to the DC motor is stopped and a voltage across the terminals of the DC motor; and calculating the electromotive force coefficient based on the rotational speed and the inductive voltage.

11. The method of calculating an electromotive force coefficient of a DC motor according to claim 10, wherein the elapse of time after the application of the voltage to the DC motor is stopped is proportional to the voltage across the terminals thereof; and the inductive voltage is calculated based on a relationship that the elapse of time after the application of the voltage to the DC motor is stopped is proportional to the voltage across the terminals of the DC motor.

12. An apparatus for measuring a characteristic of a DC motor, comprising:

actuating means for actuating the DC motor by applying a voltage thereto;

supply current measuring means for measuring electric current supplied to the DC motor when the DC motor rotates;

rotational speed measuring means for measuring a rotational speed of the DC motor when the DC motor rotates;

current determining means for determining electric current flowing through the DC motor when the rotation of the DC motor is locked;

stopping means for stopping the voltage application to the DC motor after the supply current measuring means measures the electric current supplied to the DC motor when the DC motor rotates and the rotational speed measuring means measures the rotational speed of the DC motor when the DC motor rotates;

inductive voltage calculating means for calculating an inductive voltage of the DC motor when the stopping means stops the voltage application to the DC motor, based on a relationship that the elapse of time after the stopping means stops the application of the voltage to the DC motor is proportional to a voltage across terminals of the DC motor; and torque calculating means for calculating a torque of the DC motor when the rotation of the DC motor is locked, based on the electric current supplied thereto, the inductive voltage thereof, the electric current flowing therethrough when the rotation of the DC motor is locked, and the rotational speed thereof.

13. The apparatus according to claim 12, wherein the torque calculating means comprises ratio calculating means for calculating a ratio of the inductive voltage of the DC motor to the rotational speed thereof, thereby calculating the torque of the DC motor when the rotation of the DC motor is locked according to a difference between the electric current when the rotation of the DC motor is locked and the electric current supplied thereto and the ratio of the inductive voltage thereof to the rotational speed thereof.

14. The apparatus according to claim 12, further comprising means for determining the characteristic of the DC motor, based on the torque of the DC motor when the rotation of the DC motor is locked.

15. The apparatus according to claim 12, wherein the rotational speed measuring means comprises pulsation voltage measuring means for measuring a pulsation voltage according to a pulsation of the electric current supplied to the DC motor, thereby measuring the rotational speed of the DC motor according to the pulsation voltage.

16. The apparatus according to claim 12, wherein the rotational speed measuring means comprises pulsation voltage measuring means for measuring pulsations generated in the electric current supplied to the DC motor as a pulsation voltage, based on the number of times cogging torque of the DC motor is generated, thereby measuring the rotational speed of the DC motor according to the pulsation voltage.

17. The apparatus according to claim 12, further comprising torque calculation means for calculating the torque of the DC motor when the DC motor rotates, based on the voltage applied thereto, the electric current supplied thereto, and the rotational speed thereof.

18. The apparatus according to claim 17, further comprising means for determining the characteristics of the DC motor, based on the torque of the DC motor when the rotation of the DC motor is locked and the torque of the DC motor when the DC motor rotates.

* * * * *